United States Patent
Wu et al.

(10) Patent No.: US 11,972,186 B2
(45) Date of Patent: Apr. 30, 2024

(54) INTEGRATED CIRCUIT DEVICE DESIGN METHOD AND SYSTEM

(71) Applicants: TAIWAN SEMICONDUCTOR MANUFACTURING COMPANY, LTD., Hsinchu (TW); TSMC NANJING COMPANY, LIMITED, Jiangsu (CN)

(72) Inventors: Qiuyuan Wu, Hsinchu (TW); Shuang Dai, Hsinchu (TW); Chia-Chun Liao, Hsinchu (TW); Meng-Hsuan Wu, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 284 days.

(21) Appl. No.: 17/480,358

(22) Filed: Sep. 21, 2021

(65) Prior Publication Data

US 2023/0053711 A1 Feb. 23, 2023

(30) Foreign Application Priority Data

Aug. 19, 2021 (CN) .......................... 202110955506.8

(51) Int. Cl.
G06F 30/30 (2020.01)
G06F 30/333 (2020.01)
G06F 30/392 (2020.01)
G06F 30/398 (2020.01)

(52) U.S. Cl.
CPC .......... *G06F 30/333* (2020.01); *G06F 30/392* (2020.01); *G06F 30/398* (2020.01)

(58) Field of Classification Search
CPC .... G06F 30/333; G06F 30/392; G06F 30/398; G06F 30/373; G06F 30/367; G06F 30/394; G06F 2115/06
See application file for complete search history.

(56) References Cited

U.S. PATENT DOCUMENTS

| | | | |
|---|---|---|---|
| 6,209,123 B1 * | 3/2001 | Maziasz | G06F 30/39 716/135 |
| 7,260,442 B2 | 8/2007 | Hwang et al. | |
| 7,302,663 B1 * | 11/2007 | Gan | G06F 30/30 716/112 |
| 8,694,945 B2 | 4/2014 | Wang et al. | |
| 9,256,709 B2 | 2/2016 | Yu et al. | |
| 9,830,418 B2 | 11/2017 | Peng | |
| 2007/0234264 A1 * | 10/2007 | Ono | G06F 30/398 716/112 |
| 2014/0040838 A1 | 2/2014 | Liu et al. | |
| 2015/0278429 A1 | 10/2015 | Chang | |
| 2016/0267217 A1 | 9/2016 | Takemura | |
| 2020/0050731 A1 * | 2/2020 | Yu | G06F 30/36 |

* cited by examiner

*Primary Examiner* — Jack Chiang
*Assistant Examiner* — Brandon Bowers
(74) *Attorney, Agent, or Firm* — Hauptman Ham, LLP

(57) ABSTRACT

A method of designing an integrated circuit (IC) device includes identifying, with a processor, a pin failing a test to determine an antenna effect, identifying, with the processor, a net corresponding to the identified pin failing the test to determine the antenna effect, and creating, with the processor, an engineering change order (ECO) script based on the identified net to insert a diode to address the antenna effect.

20 Claims, 11 Drawing Sheets

INTEGRATED CIRCUIT DEVICE DESIGN METHOD AND SYSTEM

BACKGROUND

The ongoing trend in miniaturizing integrated circuits (ICs) has resulted in progressively smaller and lower power devices that provide increased functionality at high speeds. The miniaturization process has also resulted in increasingly strict design and manufacturing specifications. Various electronic design automation (EDA) tools are developed to generate, optimize, and verify designs for semiconductor devices while ensuring that the design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
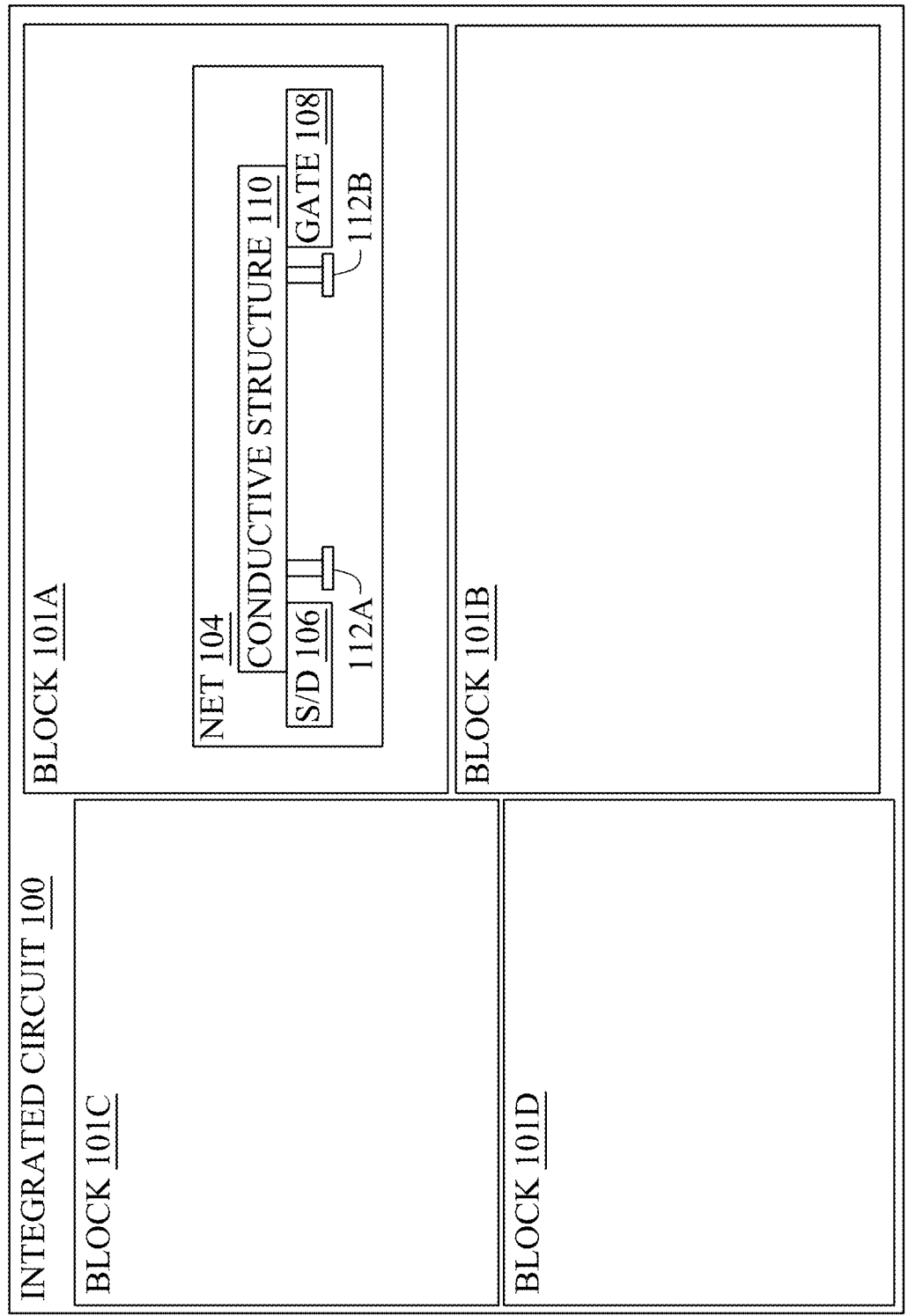
FIG. 1 is a diagram of an integrated circuit (IC), in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a software engine, such as an assist antenna fix engine (AAFE), extracts a number of diodes that are placed within an integrated circuit (IC) to address antenna effect. In some embodiments, the software engine extracts a placement location for the diodes within the IC to address the antenna effect. Antenna effect is a colloquial term for plasma induced gate oxide damage (for sake of brevity, these terms are used interchangeably throughout this description). Antenna effect causes yield and reliability problems in the manufacturing of metal oxide semiconductor (MOS) ICs. Antenna effect occurs when a charge, that is often higher than the normal operating voltage of the IC, collects on the IC, commonly during manufacturing of the IC, and the charge causes damage to the gate oxide.

In some other approaches, engineers attempt to visually identify, on graphic design system II (GDSII) representations of a manufactured IC, potential damage sites, then add one or more diodes (e.g., a source/drain implant forming a diode that breaks down at a lower voltage than the gate oxide) according to their experience. This process is both labor and time intensive and potentially damaged gate oxides can be missed by engineers regardless of experience. In this approach, engineers also might adopt inaccurate diode counts that lead to unnecessary diode additions, possibly affecting automatic place and route (APR) tools' ability to route electrical connections through multiple layers.

In some embodiments, AAFE automatically identifies the number of diodes needed to fix an antenna violation. Additionally or alternatively, AAFE generates an engineering change order (ECO) script that is used by an EDA tool to implement the repair. In some embodiments, an accurate number of diodes are identified. Additionally or alternatively, compared to other approaches, by identifying the correct number of diodes, the timing challenge of IC manufacturing is lowered, routing congestion is decreased (as only the necessary number of diodes are implemented) and parasitic capacitance and parasitic resistance is lowered by avoiding an overestimated diode count. In some embodiments, the AAFE's processing time is much better than multiple trial and error iterations with human engineers performing the antenna violation identification and diode insertion. In some embodiments, the AAFE increases the productivity of IC manufacturing. Additionally or alternatively, the AAFE is compatible with APR and EDA tools.

FIG. 1 is a diagram of an integrated circuit (IC) 100, in accordance with some embodiments.

In some embodiments, IC 100 includes a set of cell blocks 101A, 101B, 101C, and 101D (hereinafter referred to collectively as cell blocks 101). Each cell block 101 includes one or more nets 104 with a source or drain region 106 (hereinafter S/D region 106) and a gate electrode 108. FIG. 1 depicts a single instance of net 104 for the purpose of illustration. In various embodiments, each cell block 101 includes substantially more than a single instance of net 104.

Each net 104 includes portions or all of one or more IC layout cells (not shown), e.g., standard cells. Standard cells, which typically correspond to a logical functionality (NAND, NOR, latch, or the like), are used as building block of ICs. In a standard cell place and route methodology, standard cells comprising a plurality of semiconductor devices are generated and are stored in a standard cell library. Integrated chip layouts are then constructed by APR tools, which place selected standard cells next to one another in the IC layout.

In the embodiment depicted in FIG. 1, for the purpose of illustration, net 104 includes a conductive structure 110 that electrically connects S/D region 106 with a single instance of gate electrode 108 corresponding to an access pin (also referred to as a pin or receiver) of a single cell. In various embodiments, net 104 includes a plurality of pins corresponding to one or more cells. In some embodiments, net 104 includes net 400 discussed below with respect to FIG. 4.

Conductive structure 110 is a plurality of conductive features arranged to provide electrical connections among the elements of net 104, e.g., S/D region 106 and gate electrode 108. In various embodiments, conductive structure 110 includes pluralities of conductive regions configured to at least partially define conductive segments of metal layers and inter-layer via structures. In some embodiments, the conductive regions of conductive structure 110 are arranged by an APR tool.

In some embodiments, a set of diodes 112A and 112B (hereinafter referred to as diodes 112) are electrically connected to conductive structure 110 after the AAFE has determined an antenna violation in net 104 and/or gate electrode 108. In some embodiments, one of or both of diodes 112A or 112B are electrically connected to conductive structure 110 in response to AAFE detecting an antenna violation.

In some embodiments, IC 100 is a set of electronic circuits on one small flat piece of semiconductor material (e.g., a wafer or substrate), usually silicon. In some embodiments, IC 100 has tens, hundreds, thousands, or even millions of blocks 101 on a single IC. In some embodiments, within blocks 101 large numbers of tiny MOSFETs (metal—oxide—semiconductor field-effect transistors) are integrated. In some embodiments, IC 100 is designed using IC device design system 1000 discussed below with respect to FIG. 10 and/or manufactured with IC manufacturing system 1100 discussed below with respect to FIG. 11.

In some embodiments, block 101 is a block of IC layout cells that APR tools (e.g., Cadence Innovus®) populate based on an algorithm, e.g., an algorithm including one or more iterative operations.

In some embodiments, a cell, in the context of an EDA, is a representation of a component within a schematic diagram or physical layout of an electronic circuit in software. Additionally or alternatively, a cell-based design methodology is a technique that enables designers to analyze chip designs at varying levels of abstraction.

In some embodiments, a net 104 includes at least one driver (e.g., a source or drain region 106) and at least one receiver (e.g., a gate electrode 108 over a thin gate oxide). Since the gate oxide is thin, a breakdown of this layer is a concern. A breakdown of the oxide can occur when net 104 acquires a voltage higher than the normal operating voltage of IC 100. FIG. 1 shows net 104 in IC 100. In some embodiments, net 104 is one of tens, hundreds, thousands, or even millions of nets within IC 100.

In some embodiments, S/D region 106 is a region where impurities are intentionally introduced into a semiconductor for the purpose of modulating its electrical, optical and structural properties. Additionally or alternatively, the source or drain are elements of a transistor, such as a MOS field effect transistor (MOSFET). Transistors typically comprise a source terminal, a drain terminal and a gate, where the gate is separated from the source and drain by an insulating layer, such as a gate oxide. In operation, a voltage at the gate controls a current between the source and drain.

In some embodiments, conductive structure 110 that electrically connects S/D region 106 and gate electrode 108 is electrically connected to S/D region 106 and gate electrode 108 by vias (not shown) that are electrical connections between layers in IC 100 that go through the plane of one or more adjacent layers. In some embodiments, conductive structure 110 includes gold, copper, aluminum, and/or silver.

In some embodiments, diode 112 is a two-terminal electronic component that conducts current primarily in one direction; it has low resistance in one direction, and high resistance in the other. Additionally or alternatively, diode 112 protects the gate oxide from breaking down during manufacturing when S/D region 106 is not electrically connected to gate electrode 108. For purposes of brevity, oxide and dielectric are used interchangeably throughout the disclosure.

A violation of the antenna rules is called an antenna violation. Antenna rules are often expressed as an allowable ratio of conductive structure area to gate electrode area. Typically, the area that is counted is more than one polygon; it is the total area of all conductive structures connected to gate electrodes without being connected to a source/drain region. When the IC supports different gate oxides, such as a thick oxide for higher voltages and a thin oxide for high performance, then each oxide will have different rules. There are cumulative rules, where the sum (or partial sum) of the ratios over all conductive structures determines the limit. There are rules that consider the periphery of each structure, as well.

In some embodiments, during the fabrication of IC 100, the gate oxide may not be protected by a diode (e.g., S/D region 106 is not electrically coupled to gate electrode 108 or any conductors electrically connected to the gate electrode, such as conductive segments, vias or other gate electrodes). When conductive structure 110 is not yet completed, a charge added to gate electrode 108 is capable of breaking down the gate oxide. In particular, reactive-ion etching of a metal layer produces this situation.

Figure 2:
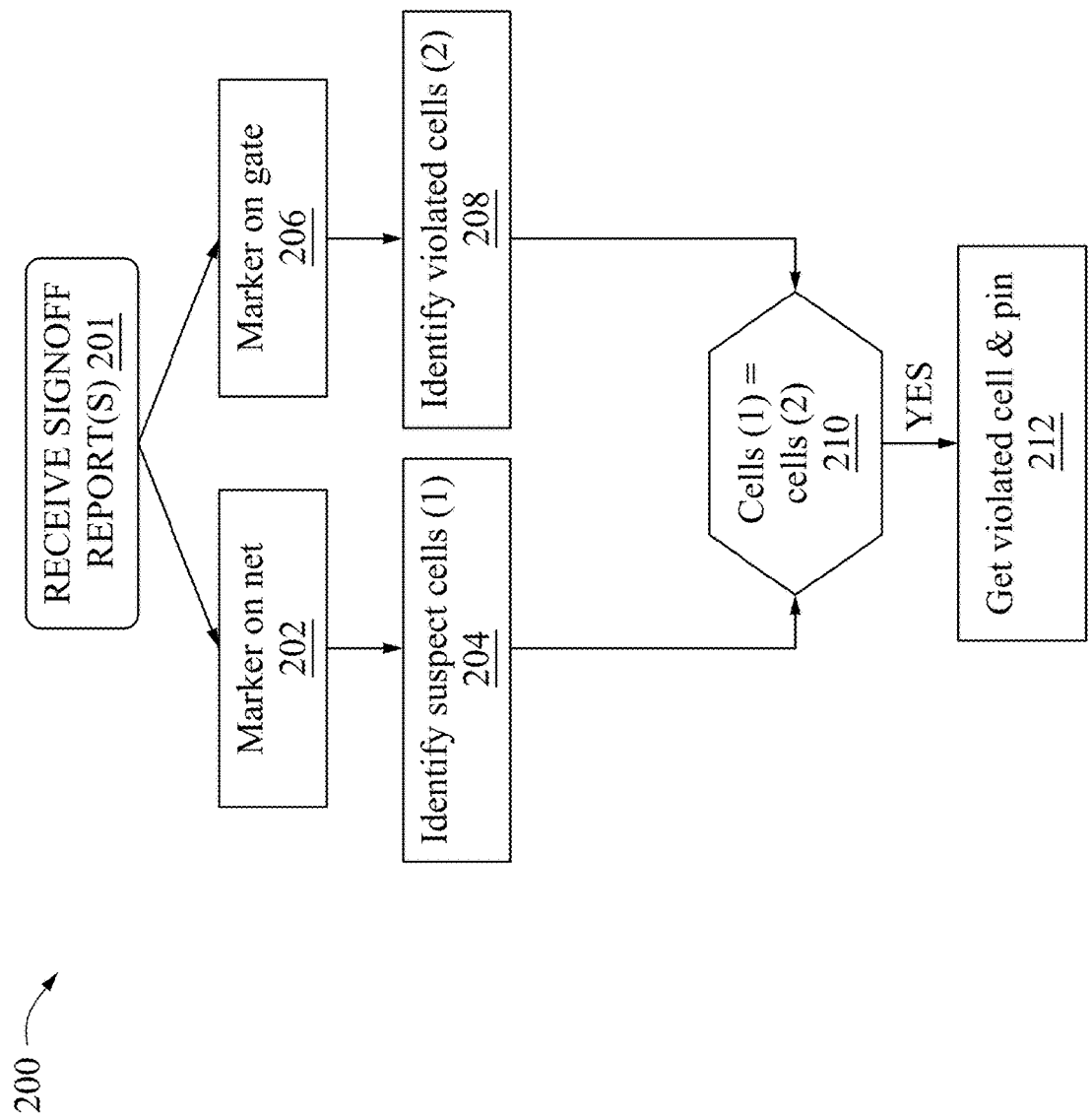
FIG. 2 is a flowchart of a method of identifying an impact pin and cell, in accordance with some embodiments.

FIG. 2 is a flowchart of a method 200 of identifying an impact pin and cell, in accordance with some embodiments.

Method 200 is usable to create IC 100 with an IC device design system, e.g., IC device design system 1000 discussed below with respect to FIG. 10, and/or with an IC manufacturing system, e.g., an IC manufacturing system 1100 discussed below with respect to FIG. 11.

The sequence in which the operations of method 200 are depicted in FIG. 2 is for illustration only; the operations of method 200 are capable of being executed in sequences that differ from that depicted in FIG. 2. In some embodiments, operations in addition to those depicted in FIG. 2 are performed before, between, during, and/or after the operations depicted in FIG. 2.

In some embodiments, one or more of the operations of method 200 are a subset of operations of a method of designing an IC device. In some embodiments, one or more of the operations of method 200 are a subset of operations of a method of manufacturing an IC device. In various embodiments, one or more of the operations of method 200 are performed by using one or more processors, e.g., a processor 1002 discussed below with respect to IC device design system 1000 and FIG. 10.

In some embodiments, AAFE in method 200 automatically, identifies an impact pin and an impact cell based on one or more signoff reports from an EDA. Additionally or alternatively, impact pin refers to an electrical connection to a cell that is impacted by an antenna violation, and an impact cell refers to a cell that includes one or more impact pins.

In some embodiments, EDA is a category of software tools for designing electronic systems such as integrated circuits and printed circuit boards. The software tools work together in a design flow that is used to design and analyze entire ICs. Since ICs can have billions of components, EDA tools are useful for their design. Additionally or alternatively, AAFE is a software engine that is compatible with EDA tools to both interpret signoff reports and for producing ECO scripts to make design changes within the EDA. In some embodiments, an ECO, also called an engineering change note, engineering change notice (ECN), or engineering change (EC), is an artifact used to implement changes to components or end products. Additionally or alternatively, the ECO is utilized to control and coordinate changes to product designs that evolve over time. In some embodiments, ECO is the process of inserting a logic change directly into the netlist after it has already been processed by an automatic tool. Before chip masks are made, ECOs are usually done to save time, by avoiding the need for full ASIC logic synthesis, technology mapping, place, route, layout extraction, and timing verification.

In some embodiments, a signoff report is the colloquial name given to a series of verification steps that an IC design passes before it can be taped out (e.g., the final result in the design process before manufacturing). IC design is an iterative process involving incremental fixes across the board using one or more check types, and then retesting the design. In some embodiments, a signoff report is the design rule checking (DRC) signoff. Also sometimes known as geometric verification, DRC involves verifying that the design can be reliably manufactured given current photolithography and other manufacturing limitations. In some embodiments, a signoff report is the functional static signoff check that uses search and analysis techniques to check for design failures under known test cases. In some embodiments, a signoff report includes one or more files, e.g., cell pin information and process antenna information for each cell pin.

In some embodiments, at operation 201, the AAFE receives a signoff report and automatically identifies one or more antenna violations at a pin level (e.g., conductive structure) based on the signoff report. In some embodiments, at operation 201, AAFE receives more than one signoff report from the EDA.

At various stages of a manufacturing process, a given pin of a particular cell is electrically connected to various additional pins and conductive elements of an associated net based on the conductive features present as metal layers are added at successive stages. The lowest metal layers present early in the process provide local electrical connections between pins, e.g., within a given cell or among adjacent or nearby cells. As the number of metal layers increases, the numbers of electrically connected pins and cells potentially increase, and the area over which the conductive features of the net extends potentially increases. In various embodiments, automatically identifying an antenna violation includes identifying an impact pin based on the electrical connections of a given net at the various manufacturing stages and on the electrical connections to a given pin of a particular cell at the various manufacturing stages.

In various embodiments, automatically identifying an antenna violation includes performing a calculation based on a ratio of a metal property, e.g., a surface area, to a gate area, and comparing a result of the calculation to a threshold value. In some embodiments, the metal property corresponds to some or all of the conductive features of a net, e.g., conductive features of conductive structure 110 of net 104 discussed above with respect to FIG. 1, present at a given manufacturing stage. In some embodiments, the metal property corresponds to the conductive features of a topmost layer of the net at the given manufacturing stage. In some embodiments, the metal property is a maximum value corresponding to the conductive features associated with a plurality of manufacturing stages.

In some embodiments, the gate area includes the area of a single gate. In some embodiments, the gate area includes a cumulative gate area of some or all of the gates in a given cell or in a plurality of adjacent or nearby cells. In some embodiments, the gate area includes a cumulative gate area of some or all of the gates of one or more nets. In some embodiments, the gate area includes a cumulative gate area corresponding to electrical connections to one or more gates present at a given manufacturing stage.

In some embodiments, threshold values are based on one or more cell attributes obtained from the signoff report. In some embodiments, threshold values are based on one or more of gate oxide thickness, gate oxide material composition, capacitance values, substrate doping concentrations, or other suitable design criteria.

Comparing the ratio to the threshold value includes identifying an antenna violation based on the ratio being greater than or equal to the threshold value, thereby indicating that a charge accumulation on the gate or gates collected by the included conductive segments is considered to be capable of causing gate oxide damage. In various embodiments, a given gate or pin is included in multiple ratio calculations and comparisons to one or more threshold values.

Automatically identifying the antenna violation includes identifying at least one impact pin failure based on at least one ratio-based calculation.

In some embodiments, method 200 moves to operation 202 where a marker or identifier (see FIG. 6) is placed on each net including an impact pin with an antenna violation. At operation 204, a software application, e.g., the APR tool, is used to identify one or more cells associated with the marked net and thereby suspected of having an antenna violation.

In some embodiments, after operation 201, method 200 proceeds to operation 206 where AAFE evaluates the one or more signoff reports and places a marker on each gate, such as a gate including gate electrode 108, if the gate is determined to violate one or more antenna rules as determined by the AAFE based upon the one or more signoff reports. At operation 208, a software application, e.g., the APR tool, is used to identify the cells containing the marked gates based upon the gate markers.

In some embodiments, at operation 210, the AAFE determines whether the cells identified, e.g., by the APR tool, in operation 204 match the cells identified, e.g., by the APR tool, in operation 208. At operation 212, for each case in which the cells are the same, the AAFE obtains the location of both the violated cell and the violated pin. In some embodiments, AAFE generates an ECO script for the EDA that implements one or more diodes in the net to address the antenna violation. In some embodiments, implementing the diode in the net includes adding a diode cell to the net by including the diode cell in the IC layout.

Figure 3:
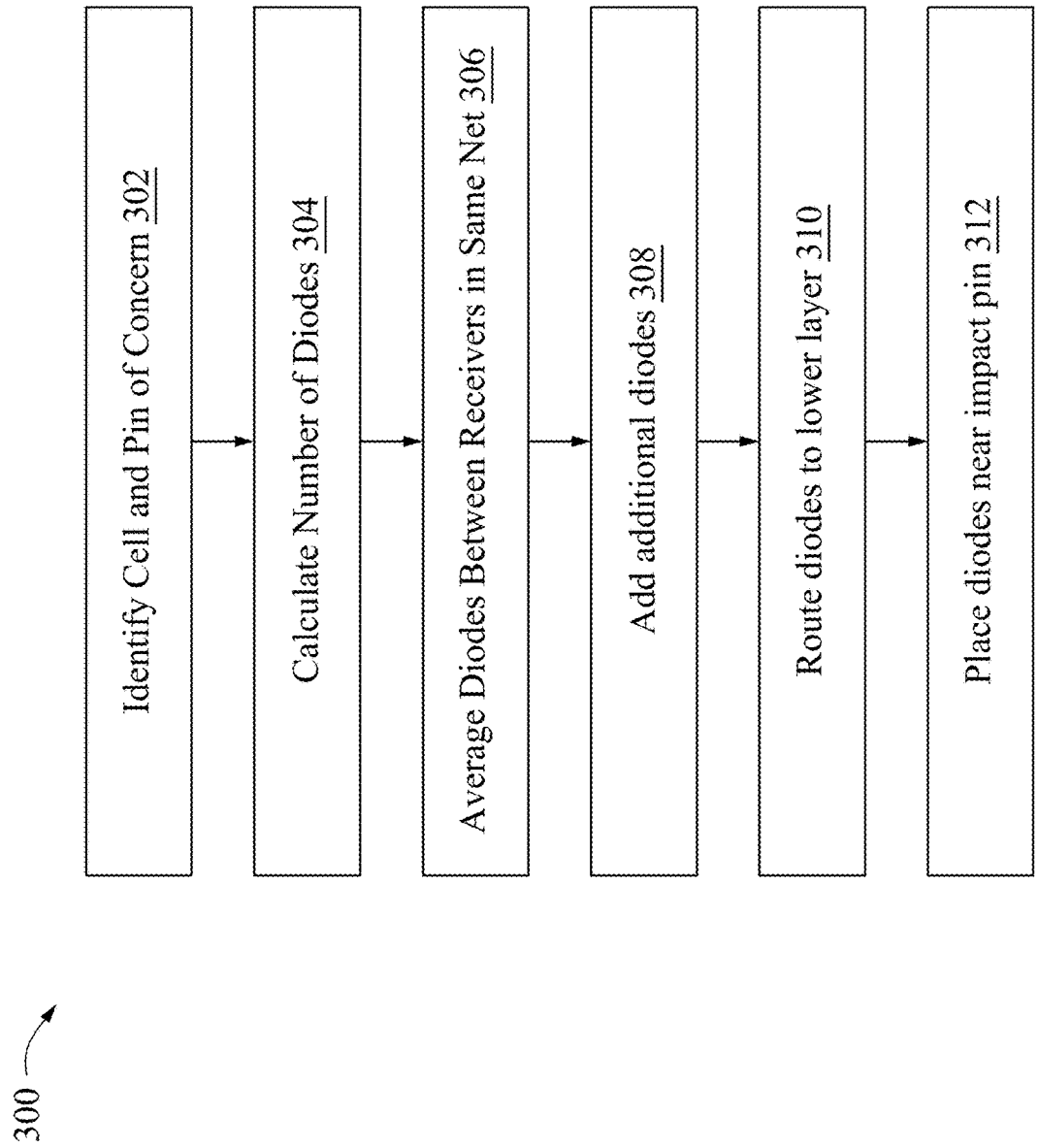
FIG. 3 is a flowchart of a method of determining a diode number, in accordance with some embodiments.

FIG. 3 is a flowchart of a method 300 of determining a diode number, in accordance with some embodiments.

Method 300 is usable to create IC 100 with an IC device design system, e.g., an IC device design system 1000 discussed below with respect to FIG. 10, and/or with an IC manufacturing system, e.g., an IC manufacturing system 1100 discussed below with respect to FIG. 11.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, during, and/or after the operations depicted in FIG. 3.

In some embodiments, one or more of the operations of method 300 are a subset of operations of a method of designing an IC device. In some embodiments, one or more of the operations of method 300 are a subset of operations of a method of manufacturing an IC device. In various embodiments, one or more of the operations of method 300 are performed by using one or more processors, e.g., processor 1002 discussed below with respect to IC device design system 1000 and FIG. 10.

In some embodiments, the operations of method 300 are similar to the operations of method 200 of FIG. 2, and similar detailed description will not be described in at least FIG. 3 for brevity.

In some embodiments, at operation 302, the AAFE identifies the cell and pin with an antenna violation. Additionally or alternatively, this identification of the cell and the pin are the same or similar to method 200. In some embodiments, the AAFE uses equation (1) to determine if there is an antenna violation and identify the cell and pin of concern. Additionally or alternatively, equation (1) is one example. In some embodiments, each rule has a different equation. Additionally or alternatively, AAFE simplifies the equation (1) to obtain the diode number.

$$\frac{A}{(X \cdot 2.5)} - Y \cdot 83 - 400 > 0 \qquad \text{eq. (1)}$$

A is a constant based on one or more design rules of a manufacturing process, X is a gate oxide related index, and Y is a diffusion, or doping concentration, related index. The index X is determined by the EDA tool based upon the IC design. In some embodiments, different designs have different values of X. The index Y is also based upon the IC design and in some embodiments, different designs have different values of Y. In some embodiments, the X and/or Y index is defined in or based on design information included in a cell LEF file.

Increasing values of index X correspond to increasing gate area and thereby to increasing capacity to receive charge generated by manufacturing operations without incurring gate oxide damage. Thus, increasing values of the ratio A/X*2.5 correspond to decreasing capacity to receive charge without incurring oxide damage.

Increasing values of index Y correspond to increasing resistance to gate oxide damage based on substrate features associated with gate structures, e.g., diffusion profiles and/or doping concentrations. Thus, increasing values of the term Y*83 correspond to increasing capacity to receive charge without incurring oxide damage.

In some embodiments, the AAFE inputs the A constant and the X and Y gate related indexes into equation (1) to determine if an antenna violation exists. If the result of the left hand side of equation (1) is greater than zero, then an antenna violation exists. In some embodiments, the AAFE identifies, records, and marks the cell and pin of concern.

From operation 302, method 300 progresses to operation 304 where AAFE calculates a number of diodes to address the detected antenna violation. In some embodiments, the AAFE uses equation (2) and solves for n, where n is a number representing a number of diodes calculated to resolve the antenna violation.

$$\frac{A}{(X \cdot 2.5 + \text{gate} \cdot n)} - (Y + \text{diff} \cdot n) \cdot 83 - 400 \le 0 \qquad \text{eq. (2)}$$

The terms gate and diff are cell attributes and are obtained from design kits (e.g., LEF, GDS, etc.) in some embodiments. Increasing values of each of the cell attributes correspond to increasing ability of a diode to conduct excessive charge from a gate electrode to the substrate. In some embodiments, the term gate in equation (2) represents a gate area value and the term duff in equation (2) represents a diffusion area value. In some embodiments, implementing a minimum number of diodes to prevent an antenna violation minimizes power usage, parasitic capacitance, parasitic resistance, and/or cell, block and/or IC area concerns.

Figure 4:
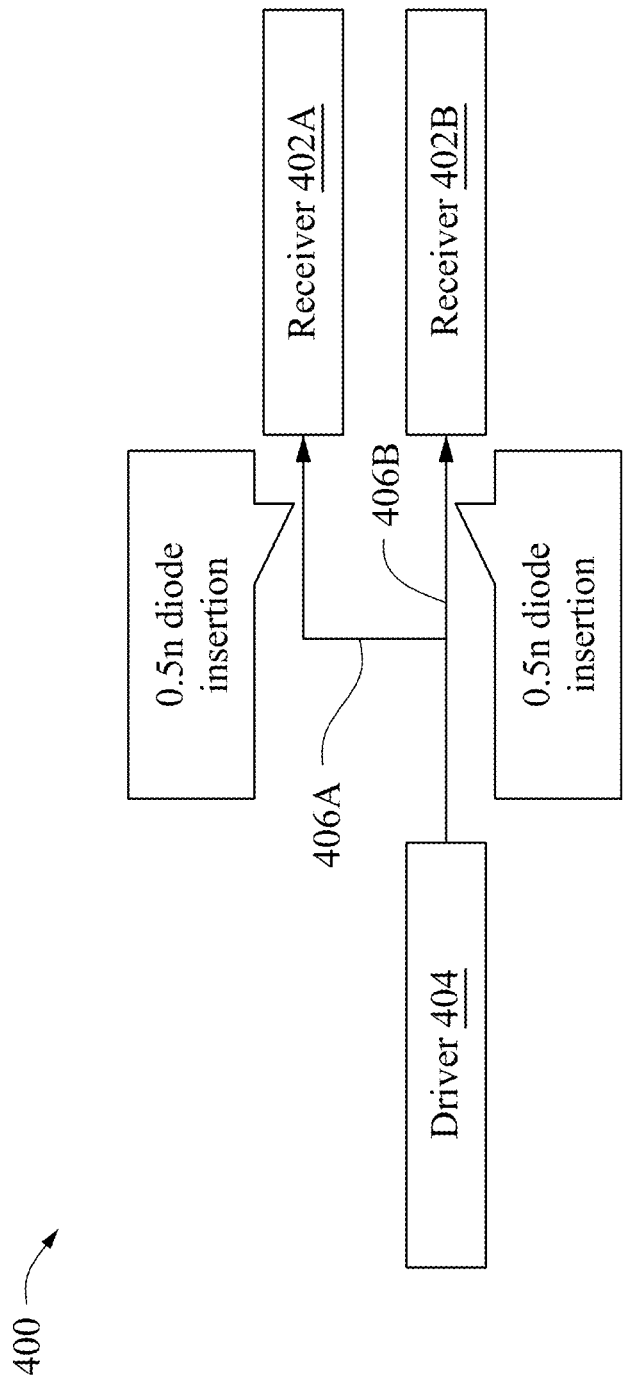
FIG. 4 is a block diagram of a net having multiple receivers, in accordance with some embodiments.

FIG. 4 is a block diagram of net 400 having multiple receivers 402, in accordance with some embodiments.

From operation 304, method 300 progresses to operation 306 where the AAFE splits or averages the n-number of diodes within net 400 (FIG. 4) between one or more gate electrodes 402 (receivers 402A and 402B) coupled to the same driver 404 (S/D region) (FIG. 4). For purposes of brevity, gate electrodes are used interchangeably with receivers and S/D regions are used interchangeably with drivers for the purpose of this disclosure. In some embodiments, the diodes are split amongst pin 406A and pin 406B. For example, the AAFE determines, from equation (2), ten diodes are to be inputted into net 400. According to operation 306 of method 300, five diodes are electrically connected to pin 406A and five diodes are electrically connected to pin 406B. In some embodiments, splitting the diodes or averaging the diodes between the gate electrodes in the same net assists in preventing routing changes with the APR tool. In some embodiments, where only one gate electrode is within net 400, then the diodes are not split. In some embodiments, where there are N-gate electrodes, then the number of diodes determined by equation (2) is divided by N (e.g, $$\frac{n-\text{diodes}}{N-\text{gate electrodes}})$$

and the resultant number of diodes is placed at each separate pin of each of N-gate electrodes.

From operation 306, method 300 progresses to operation 308 where one or more additional diodes, beyond that calculated to repair the antenna violation in operation 306, are added in some embodiments. In some embodiments, adding one or more diodes is based on multiple calculations being performed on a single net or pin based on a given ECO version. In some embodiments, the total number of diodes after adding the one or more diodes is a maximum number of diodes determined by the multiple calculations.

In some embodiments, adding one or more diodes is based on repeating a calculation for multiple ECO versions. For example, if one of receivers 402A or 402B incurs another antenna violation upon retesting after the first ECO, then additional diodes are added to ensure the antenna violation is resolved. Continuing with the example, if after averaging the diodes between receivers 402A and 402B, AAFE, at operation 302, determines receiver 402A has another antenna violation. AAFE then automatically implements an additional five diodes to pin 406A. If another retest and antenna violation occur, AAFE implements an additional four diodes to pin 406A. And, if yet another retest and antenna violation occur, AAFE implements another ten diodes to pin 406A.

Figure 5B:
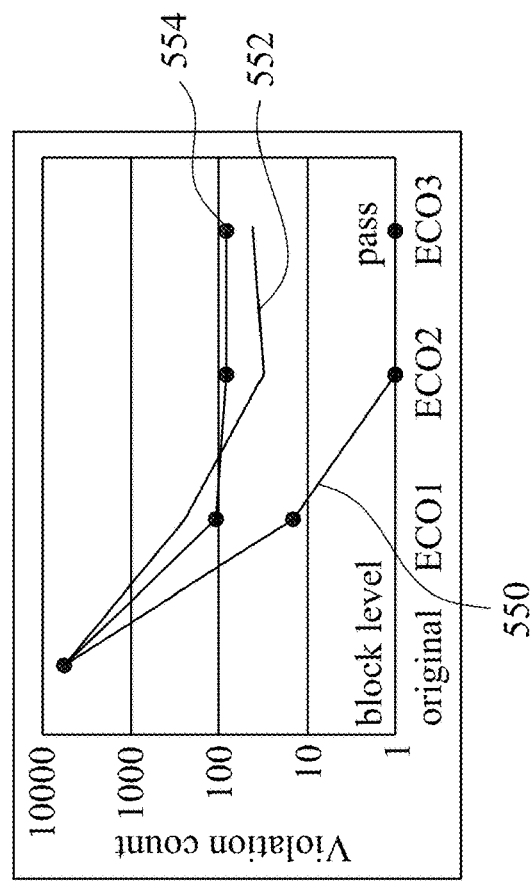
FIG. 5B is a table showing antenna violations per engineering change order (ECO), in accordance with some embodiments.
Figure 5A:
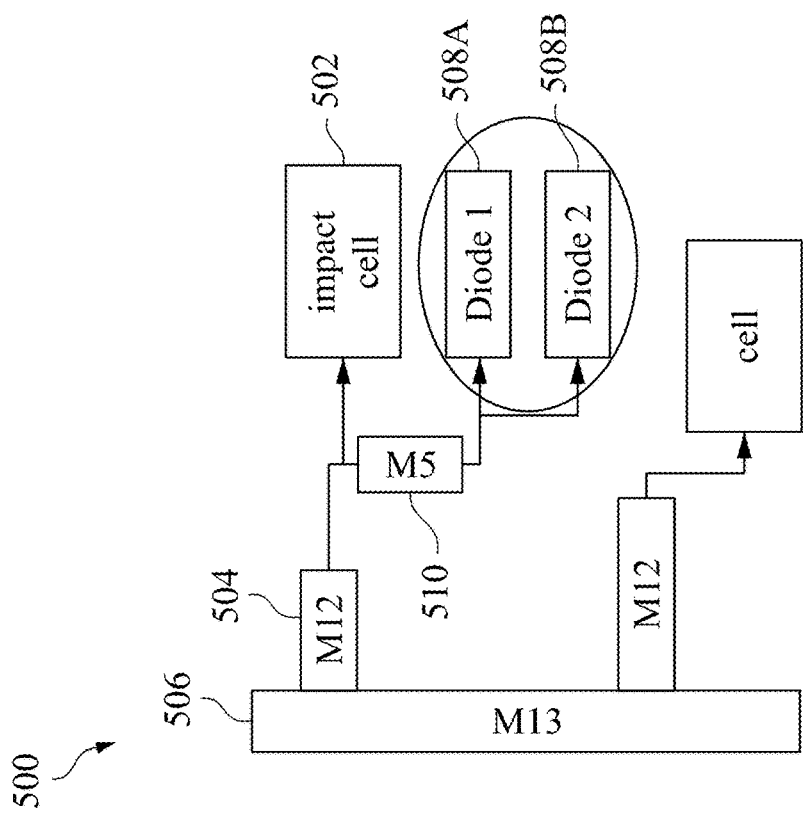
FIG. 5A is a block diagram of a net with lower level diodes, in accordance with some embodiments.

FIG. 5A is a block diagram of a net 500 with lower level diodes 508, in accordance with some embodiments.

From operation 308, method 300 progresses to operation 310 in some embodiments, where, if possible, diodes added at operations 306 and/or 308 are implemented in a metal layer lower than the metal layer in which the diodes were initially placed. In some embodiments, lower layer routing acts to enhance immunity toward a potentially higher layer routing change.

In the non-limiting example depicted in FIG. 5A, an impact cell 502 has an antenna violation, thus cell 502 is impacted by an antenna violation. Impact cell 502 is electrically coupled to a conductive structure including a conductive segment 510 located on a 5th metallization layer (M_5th level), a conductive segment 504 that is implemented on a 12th metallization layer (M_$12^{th}$ level), and a conductive segment 506 that is implemented on a $13^{th}$ metallization layer (M_$13^{th}$ level). In some embodiments, impact cell 502 was initially repaired at operation 306 and/or 308 with two diodes 508A and 508B placed on a $14^{th}$ metallization layer (M_$14^{th}$ level—not shown) to prevent the antenna violation. At operation 310, diodes 508A and 508B are implemented on a lower metal layer and electrically connected to conductive segment 510 and thereby electrically coupled to impact cell 502.

FIG. 5B is a table showing antenna violations per ECO, in accordance with some embodiments.

From FIG. 5B, after one ECO implementing a lower layer routing for antenna violation diodes (such as diodes 508A and 508B) a number of antenna violations is lowered substantially (represented by AAFE implementation line 550 showing a drop in antenna violations from nearly 10,000 to almost 20; a reduction of nearly 500%). In some embodiments, after two ECOs the antenna violations are almost zero. In some embodiments, antenna violations are near zero by the $2^{nd}$ ECO.

When compared to AAFE implementation line 552 that represents AAFE implementation at all layers, the AAFE implemented at lower layers has a much better result. While AAFE has good results at all layers (e.g., the violations drop from nearly 10,000 to about 300; a 33% reduction).

Finally, when compared with other approaches (see implementation line 554), AAFE at all layers and using lower layers to implement the diodes to fix antenna violations lowers the number of ECO iterations and this saves time and cost.

Figure 6:
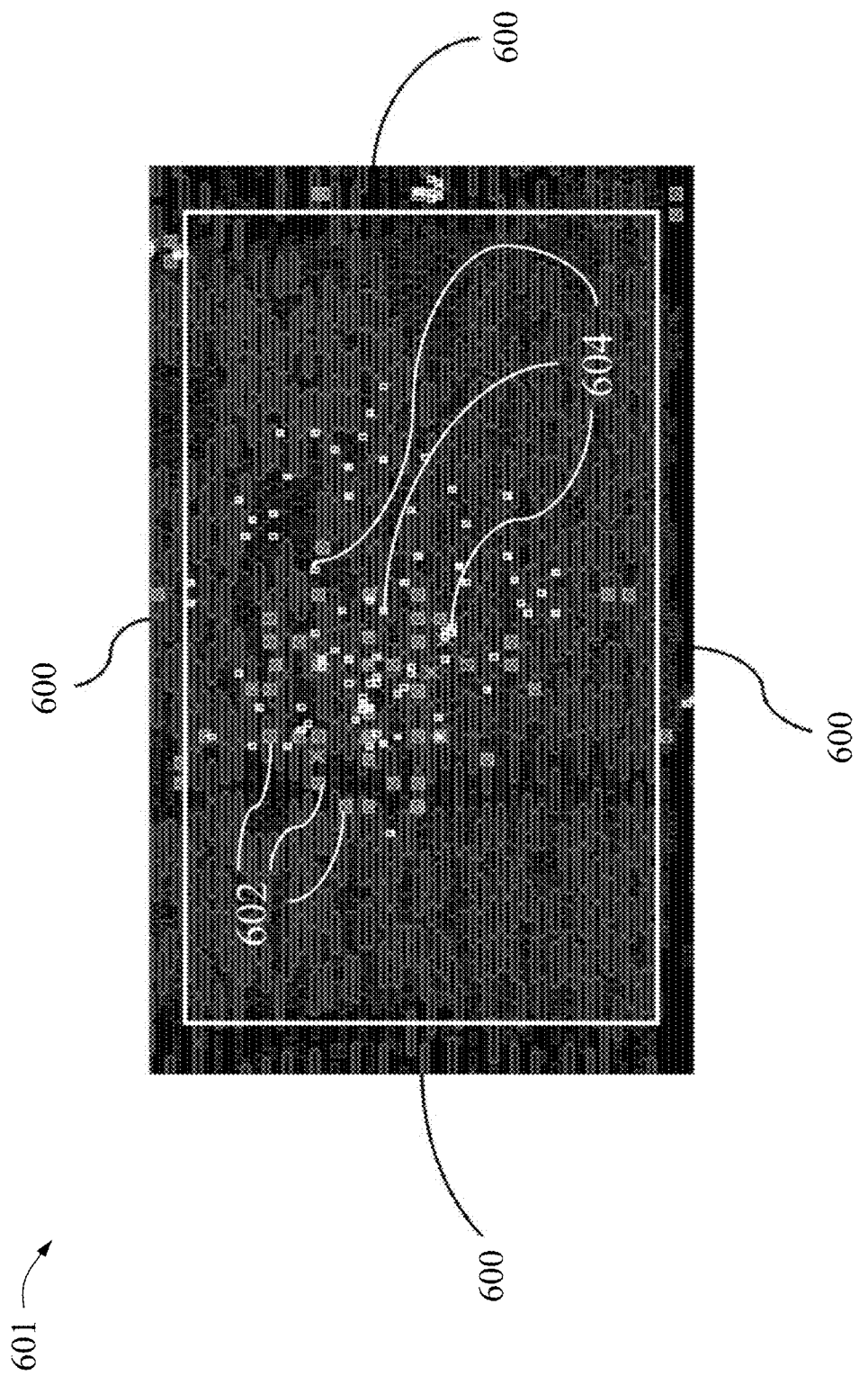
FIG. 6 is a pictorial representation of diodes placed near impact pins, in accordance with some embodiments.

FIG. 6 is a pictorial representation of diodes 604 placed near impact pins 602, in accordance with some embodiments.

From operation 310, method 300 progresses to operation 312 in some embodiments, where the number of diodes determined to repair an antenna violation are placed near to the impact pin and in some embodiments away from an outer edge 600 of the IC, such as IC 100. From operation 312, marked pins 602 are shown in a GDSII representation 601. AAFE method 300 places diodes 604 as near to the marked pins 602 as possible. In some embodiments, placing diodes 604 as close to marked pins 602 as possible reduces lengthy routing of additional pins to marked pins 602 from outer edge 600 and avoids lengthy routing induced by other antenna violations, thereby reducing parasitic capacitance and parasitic resistance, which consumes power and slows the IC down.

From FIG. 6, it is of note how AAFE pre-marks pins 602. This eliminates the need for engineers to search through the GDSII representation 601 in an effort to find all antenna violations. This saves on time, money and effort when trying to move an IC along to manufacturing as quickly as possible.

Figure 7:
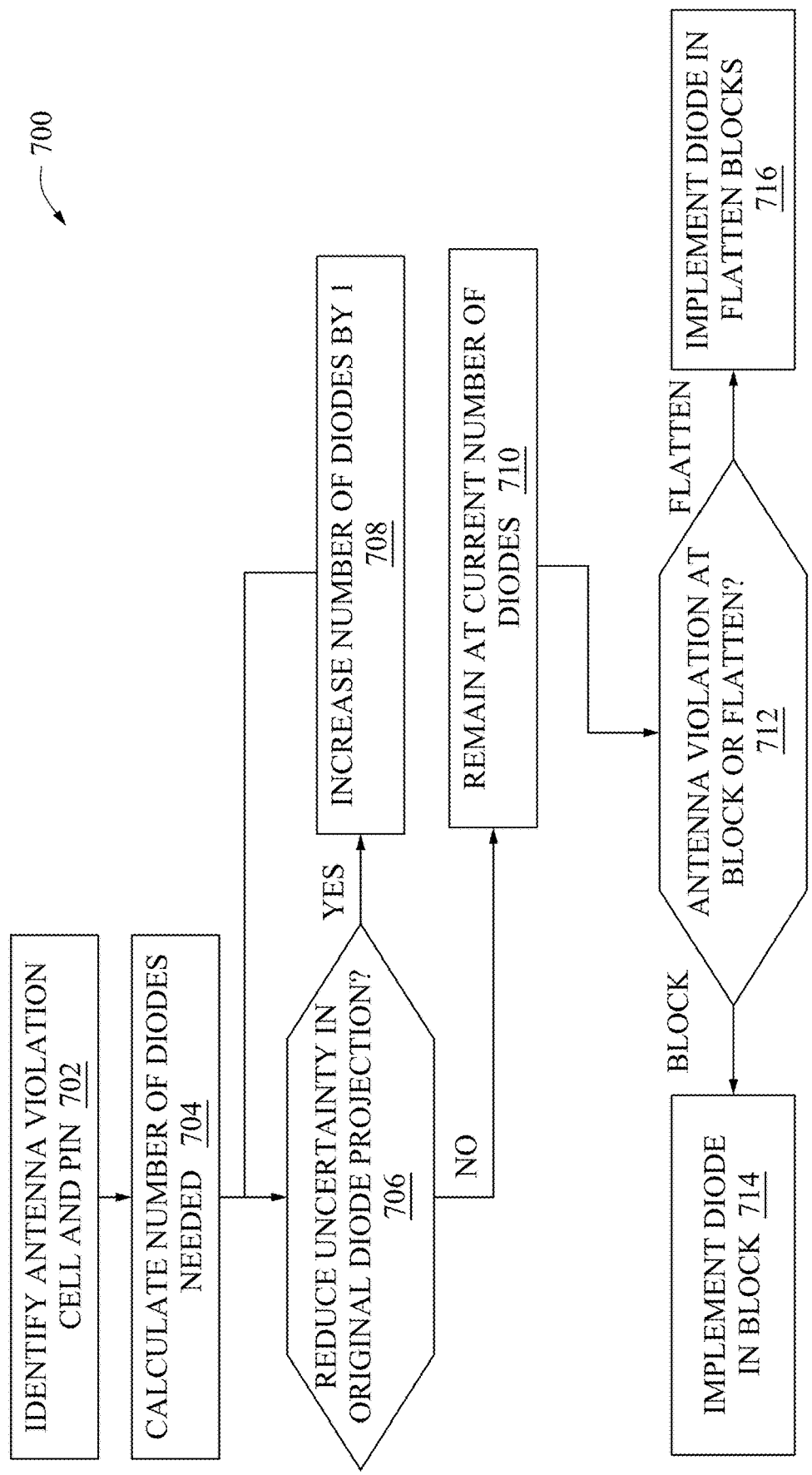
FIG. 7 is a flowchart of a method of determining a diode number, in accordance with some embodiments.

FIG. 7 is a flowchart of a method 700 of determining a diode number, in accordance with some embodiments.

Method 700 is usable to create IC 100 with an IC device design system, e.g., IC device design system 1000 discussed below with respect to FIG. 10, and/or with an IC manufacturing system, e.g., IC manufacturing system 1100 discussed below with respect to FIG. 11.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7.

In some embodiments, one or more of the operations of method 700 are a subset of operations of a method of designing an IC device. In some embodiments, one or more of the operations of method 700 are a subset of operations of a method of manufacturing an IC device. In various embodiments, one or more of the operations of method 700 are performed by using one or more processors, e.g., processor 1002 discussed below with respect to IC device design system 1000 and FIG. 10.

In some embodiments, the operations of method 700 are similar to the operations of method 200 of FIG. 2 and method 300 of FIG. 3, and similar detailed description will not be described in at least FIG. 7 for brevity.

In some embodiments, method 700 determines, at operation 702, the identity of a cell and pin with an antenna violation. In some embodiments, operation 702 is the same or similar to method 200 in determining the cell and pin with an antenna violation. In some embodiments, operation 702 is the same or similar to operation 302 of method 300.

At operation 704, a number of diodes is calculated. In some embodiments, operation 704 is the same or similar to operation 304 of method 300.

In some embodiments, method 700 progresses to operation 706 where AAFE communicates with an APR tool to determine whether a routing change is allowed for the specific cell and pin located in operation 702. In some embodiments, APR routing pattern changes are inevitable and this routing pattern change leads to uncertainty in the original diode projection. In some embodiments, to reduce the uncertainty of the original diode projection, an extra diode is added. In some embodiments, the APR tool indicates a routing change is allowed ("YES" branch of block 706) and a number of diodes to be implemented at the antenna violation pin increases by one at operation 708. In some embodiments, method 700 continues an iterative process where AAFE communicates with the APR tool to determine whether a routing change is allowed and adding another diode until the APR tool indicates a routing change is not allowed or a maximum value has been reached ("NO" branch of block 706). In some embodiments, at operation 710, the number of diodes is stopped at the last determined amount at operation 708. In some embodiments, an ECO script is created for the EDA tool and the changes are implemented in the IC design. In some embodiments, compared to an original diode count, additional diodes at the marked pin exhibit better performance and decrease the likelihood the same cell and pin will have an antenna violation in the next iteration of retesting by AAFE.

Figure 8A:
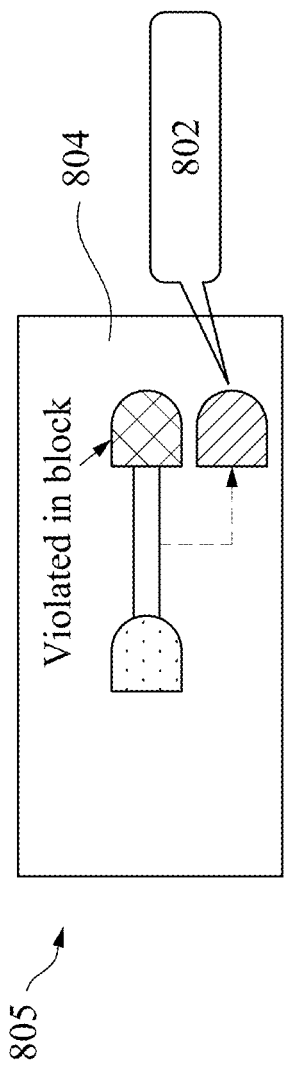
FIG. 8A is a block diagram of a net with an antenna violation, in accordance with some embodiments.

FIG. 8A is a block diagram of a net 805 with an antenna violation, in accordance with some embodiments.

In some embodiments, method 700 progresses to operation 712 where AAFE determines if an antenna violation occurred at a block level or at a flatten level. The block level corresponds to antenna violation calculations based on nets and cell pins included in a single block of cells, and the flatten level corresponds to antenna violation calculations based on multiple blocks of cells and/or includes inter-block electrical connections at a hierarchy above that of the blocks of cells. Based on the antenna violation occurring at the block level, method 700 progresses to operation 714, and based on the antenna violation occurring at the flatten level, method 700 progresses to operation 716.

In the non-limiting example depicted in FIG. 8A, when the antenna violation occurs at the block level ("BLOCK" branch of 712), one or more diodes 802 are added to a block 804 including net 805.

Figure 8B:
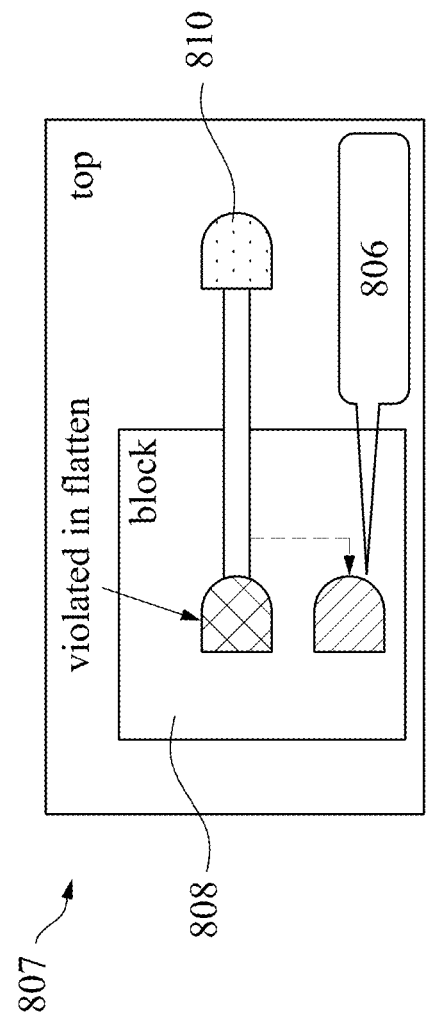
FIG. 8B is a block diagram of a net with an antenna violation, in accordance with some embodiments.

FIG. 8B is a block diagram of a net 807 with an antenna violation, in accordance with some embodiments.

In the non-limiting example depicted in FIG. 8B, when the antenna violation occurs at the flatten level ("FLATTEN" branch of 712), one or more diodes 806 are added to the portion of net 807 within a block 808. In some embodiments, the one or more diodes 806 are added to net 807 at a top level "top" or to a portion of net 807 or another net (not shown) in a block (not shown) other than block 808.

Figure 9A:
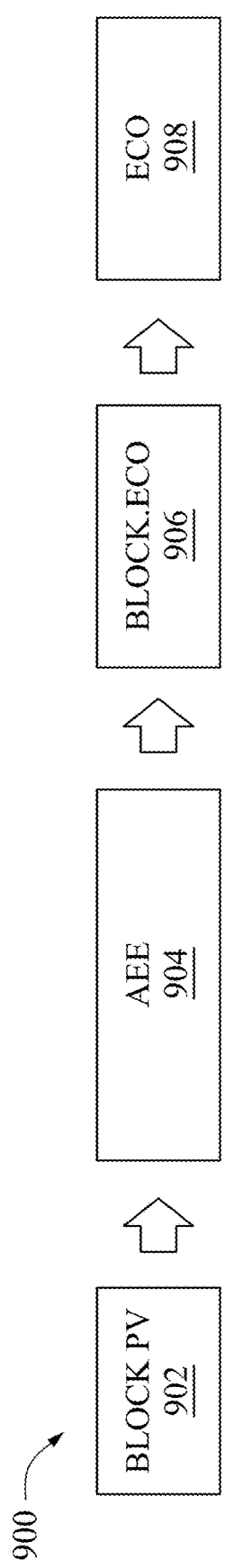
FIG. 9A is a flow diagram of a block process, in accordance with some embodiments.
Figure 9B:
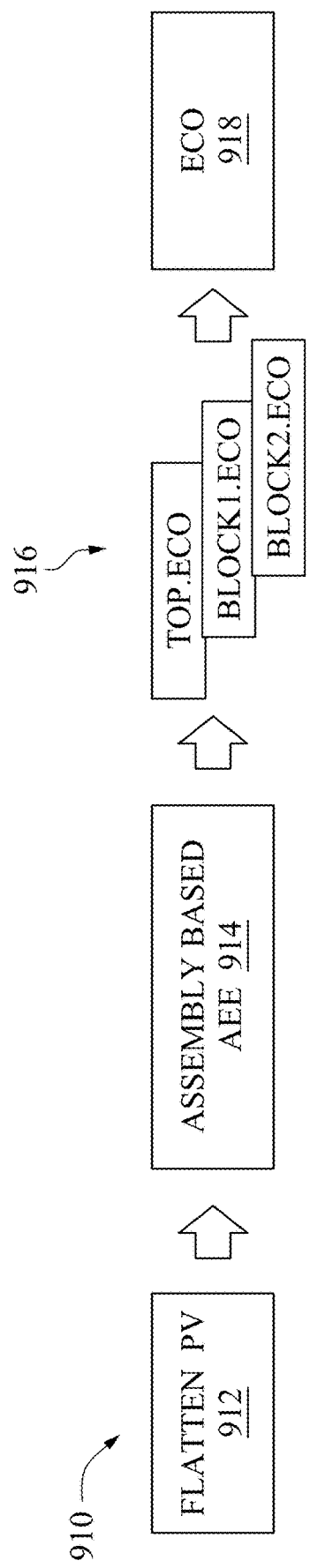
FIG. 9B is a flow diagram of a flatten process, in accordance with some embodiments.

FIGS. 9A & 9B are a flow diagrams of a block process 900 and a flatten process 910, in accordance with some embodiments.

Methods 900 and 910 are usable to create IC 100 with an IC device design system, e.g., an IC device design system 1000 discussed below with respect to FIG. 10, and/or with an IC manufacturing system, e.g., an IC manufacturing system 1100 discussed below with respect to FIG. 11.

The sequences in which the operations of methods 900 and 910 are depicted in FIGS. 9A and 9B are for illustration only; the operations of methods 900 and 910 are capable of being executed in sequences that differ from those depicted in FIGS. 9A and 9B. In some embodiments, operations in addition to those depicted in FIGS. 9A and 9B are performed before, between, during, and/or after the operations depicted in FIGS. 9A and 9B.

In some embodiments, one or more of the operations of methods 900 and 910 are a subset of operations of a method of designing an IC device. In some embodiments, one or more of the operations of methods 900 and 910 are a subset of operations of a method of manufacturing an IC device. In various embodiments, one or more of the operations of methods 900 and 910 are performed by using one or more processors, e.g., processor 1002 discussed below with respect to IC device design system 1000 and FIG. 10.

In some embodiments, the operations of methods 900 and 910 are similar to the operations of method 200 of FIG. 2, method 300 of FIG. 3, and method 700 of FIG. 7 and similar detailed description will not be described in at least FIGS. 9A and 9B for brevity.

In some embodiments, through method 900, at operation 902 the AAFE determines that one or more plasma induced gate oxide violations, an instance of a physical violation (PV), have occurred at a block operation level of the IC, such as block 101 of IC 100. In some embodiments, method 900 progresses to operation 904 and AAFE determines a repair for the one or more PVs. In some embodiments, operation 904 uses method 200, 300 or 700 to implement a repair for the PVs. In some embodiments, method 900 progresses to operation 906 and an ECO script, such as block.eco is generated by AAFE and routed to an EDA tool. In some embodiments, method 900 progresses to operation 908 where the ECO script is used by the EDA tool to make the design changes to the block and repair the PVs. In some embodiments, method 900 is used for PV repair at a block level while method 910 is used for PV repair at a flatten level (e.g., where a PV is detected outside of a cell block, but is directly electrically connected to a block).

In some embodiments, through method 910, at operation 912 the AAFE determines that one or more PVs have occurred at a flatten operation level of the IC, such as shown in FIG. 8B. In some embodiments, method 910 progresses to operation 914 and AAFE determines a repair for the one or more PVs. In some embodiments, operation 914 uses method 200, 300 or 700 to implement a repair for the PVs. In some embodiments, method 910 progresses to operation 916 and an ECO script, such as, top.eco, block1.eco, and block 2.eco is generated by AAFE and routed to an EDA tool. In some embodiments, more than one ECO script is generated as PV violations in the flatten affect more than one block or better said the repair of a PV in the flatten affects more than one block (note comparison with operation 714 and FIG. 8A where the PV repair is implemented at the block instead of the flatten). In some embodiments, method 910 progresses to operation 918 where at least one ECO script is used by the EDA tool to make the design changes to at least one block and/or an inter-block electrical connection and implement a repair for the PVs.

Figure 10:
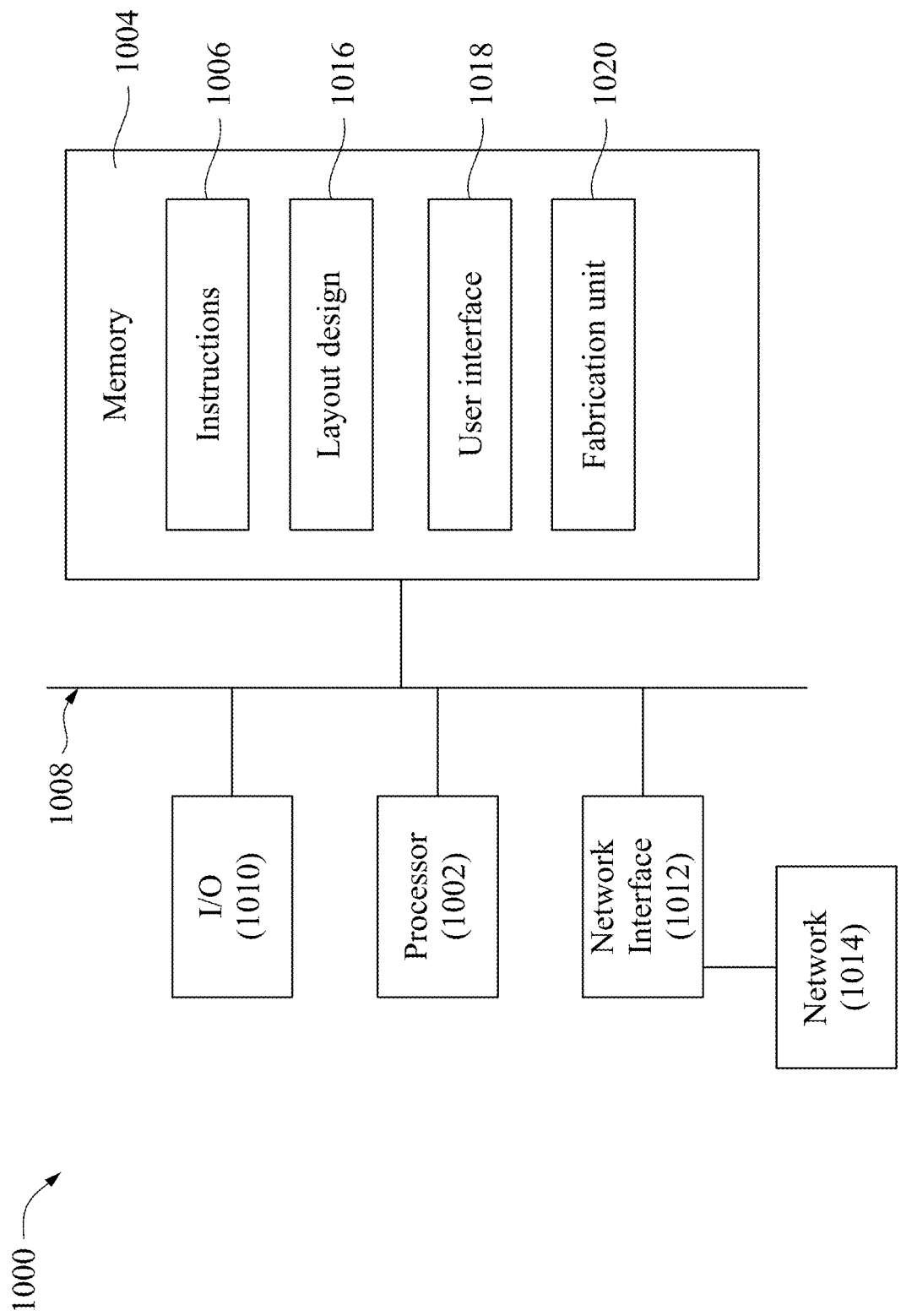
FIG. 10 is a block diagram of an IC device design system, in accordance with some embodiments.

FIG. 10 is a block diagram of IC device design system 1000, in accordance with some embodiments. One or more operations of methods 200, 300, 700, 900, or 910 discussed above with respect to FIGS. 2, 3, 7, 9A, and 9B, are implementable using IC device design system 1000, in accordance with some embodiments.

In some embodiments, IC device design system 1000 is a computing device including a hardware processor 1002 and a non-transitory computer-readable storage medium 1004. Non-transitory computer-readable storage medium 1004, amongst other things, is encoded with, i.e., stores, computer program code 1006, i.e., a set of executable instructions. Execution of instructions 1006 by hardware processor 1002 represents (at least in part) an IC device design system which implements a portion or all of, e.g., method 200 discussed above with respect to FIG. 2, method 300 discussed above with respect to FIG. 3, method 700 discussed above with respect to FIG. 7, method 900 discussed above with respect to FIG. 9A, and/or method 910 discussed above with respect to FIG. 9B (hereinafter, the noted processes and/or methods).

Processor 1002 is electrically coupled to non-transitory computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and non-transitory, computer-readable storage medium 1004 are capable of connecting to external elements via network 1014. Processor 1002 is configured to execute computer program code 1006 encoded in non-transitory computer-readable storage medium 1004 in order to cause IC device design system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, non-transitory computer-readable storage medium 1004 is an electronic, magnetic, optical, electromagnetic, infrared, and/or a semiconductor system (or apparatus or device). For example, non-transitory computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 1004 includes a compact disk-read only memory (CD-ROM), a compact disk-read/write (CD-R/W), and/or a digital video disc (DVD).

In one or more embodiments, non-transitory computer-readable storage medium 1004 stores computer program code 1006 configured to cause IC device design system 1000 to be usable for performing a portion or all of the noted processes and/or methods. In one or more embodiments, non-transitory computer-readable storage medium 1004 also stores information which facilitates performing a portion or all of the noted processes and/or methods. In various embodiments, non-transitory computer-readable storage medium 1004 stores one or a combination of at least one design rule instruction 1020, at least one set of criteria 1022, at least one design rule 1024, and/or at least one DRM 1026, each discussed above with respect to the noted processes and/or methods.

IC device design system 1000 includes I/O interface 1010. I/O interface 1010 is coupled to external circuitry. In various embodiments, I/O interface 1010 includes one or a combination of a keyboard, keypad, mouse, trackball, trackpad, display, touchscreen, and/or cursor direction keys for communicating information and commands to and/or from processor 1002.

IC device design system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 1000.

IC device design system 1000 is configured to receive information through I/O interface 1010. The information received through I/O interface 1010 includes one or a combination of at least one design rule instructions, at least one set of criteria, at least one design rule, at least one DRM, and/or other parameters for processing by processor 1002. The information is transferred to processor 1002 via bus 1008. IC device design system 1000 is configured to transmit and/or receive information related to a user interface through I/O interface 1010.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of the noted processes and/or methods, IC device design system 1000 and a non-transitory computer-readable recording medium, e.g., non-transitory computer-readable recording medium 1004, enable the benefits discussed above with respect to the noted processes and/or methods.

Figure 11:
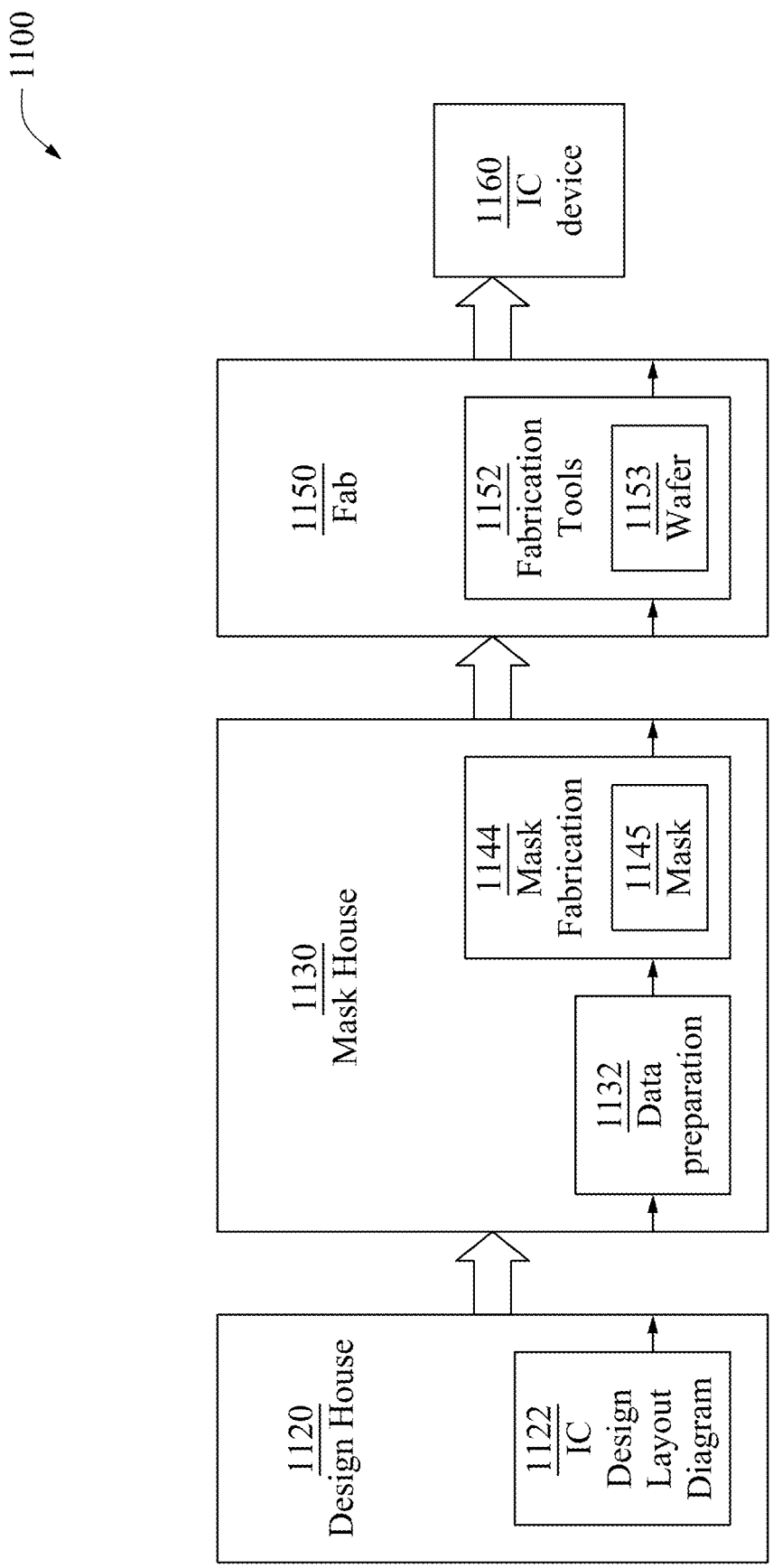
FIG. 11 is a block diagram of an integrated circuit (IC) manufacturing system, and an IC manufacturing flow associated therewith, in accordance with some embodiments.

FIG. 11 is a block diagram of IC manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122 based on the noted processes and/or methods discussed above with respect to FIGS. 2, 3, 7, 9A, and 9B. IC design layout diagram 1122 includes various geometrical patterns that correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an IC manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of designing an IC device includes identifying, with a processor, a pin failing a test to determine an antenna effect, identifying, with the processor, a net corresponding to the identified pin failing the test to determine the antenna effect, and creating, with the processor, an ECO script based on the identified net to insert a diode to address the antenna effect.

In some embodiments, a non-transitory computer-readable medium includes computer executable instructions configured to carry out a method of designing an IC, the method including identifying a pin as violating a plasma induced gate oxide damage rule, determining one or more numbers of diodes calculated based on the plasma induced gate oxide damage rule, and creating an ECO instruction to implement placing of the one or more diodes electrically connected to the identified pin.

In some embodiments, an IC device design system includes at least one processor, and at least one memory including computer program code for one or more programs, the at least one memory and the computer program code being configured to, with the at least one processor, cause the IC device design system to identify a net comprising a pin failing a test to determine an antenna effect, identify a cell comprising the pin failing the test to determine the antenna effect, and create an ECO script configured to insert a diode configured to address the antenna effect based on the identified net and cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit (IC) device, the method comprising:
   identifying, with a processor, a pin failing a test to determine an antenna effect;
   identifying, with the processor, a net corresponding to the identified pin failing the test to determine the antenna effect; and
   creating, with the processor, an engineering change order (ECO) script based on the identified net to insert a diode at a first metal layer to address the antenna effect; and
   updating the ECO script to insert the diode at a second metal layer lower than the first metal layer.

2. The method of claim 1, further comprising:
   marking, with the processor, the net of the pin failing the test to determine the antenna effect; and
   identifying, with the processor, a suspect cell of the net based on the marking using an automatic place and route (APR) tool.

3. The method of claim 2, further comprising:
   marking, with the processor, a gate that includes the pin that failed the test to determine the antenna effect; and
   identifying, with the processor, a cell including the gate based on the marking using the APR tool.

4. The method of claim 3, further comprising:
   determining, with the processor, whether the suspect cell of the net matches the cell including the pin that failed the test.

5. The method of claim 1, further comprising:
   determining, with the processor, one or more numbers of diodes needed to address the antenna effect.

6. The method of claim 5, further comprising:
   distributing, with the processor and responsive to multiple pins electrically connected to the identified net, the one or more diodes between the multiple pins based on an average.

7. The method of claim 5, further comprising:
   implementing, with the processor, a layout change to include the one or more diodes electrically coupled to the pin that failed the test to determine the antenna effect.

8. The method of claim 7, further comprising:
   implementing, with the processor, the layout change to include the one or more diodes electrically coupled to the pin that failed the test to determine the antenna effect in a metal layer below the first metal layer.

9. The method of claim 8, further comprising:
   determining, with the processor based upon an allowable routing change, one or more of additional diodes to be electrically connected to the pin failing the test to determine the antenna effect.

10. The method of claim 5, further comprising:
    adding, with the processor and responsive to a block only antenna effect failure, the one or more diodes to a block comprising the net.

11. The method of claim 5, further comprising:
    adding, with the processor and responsive to a flatten only antenna effect failure, the one or more diodes to a block comprising at least a portion of the net.

12. The method of claim 1, further comprising:
    creating, with the processor and responsive to the pin failing the test to determine the antenna effect, an engineering change order (ECO) script.

13. The method of claim 12, wherein:
the creating, with the processor, the ECO script comprises creating a block ECO.

14. The method of claim 12, wherein:
the creating, with the processor, the ECO script comprises creating a flatten ECO.

15. A non-transitory computer-readable medium comprising computer executable instructions configured to carry out a method of designing an integrated circuit (IC), the method comprising:
identifying a pin as violating a plasma induced gate oxide damage rule;
determining one or more numbers of diodes based on the plasma induced gate oxide damage rule;
creating an engineering change order (ECO) instruction to implement placing of the one or more diodes electrically connected to the identified pin, wherein a first diode of the one or more diodes is placed on a first metal layer; and
updating the ECO instruction to move the first diode to a second metal layer below the first metal layer.

16. The non-transitory computer-readable medium of claim 15, wherein:
the identifying the pin as violating the plasma induced gate oxide damage rule comprises using a gate index algorithm.

17. The non-transitory computer-readable medium of claim 16, wherein the gate index algorithm uses gate area and diffusion area to determine the one or more numbers of diodes.

18. An integrated circuit (IC) device design system comprising:
at least one processor; and
at least one memory including computer program code for one or more programs, the at least one memory and the computer program code being configured to, with the at least one processor, cause the IC device design system to:
identify a net comprising a pin failing a test to determine an antenna effect;
identify a cell comprising the pin failing the test to determine the antenna effect;
create an engineering change order (ECO) script configured to insert a diode configured to address the antenna effect based on the identified net and cell, wherein the diode is inserted at a first metal layer; and
updating the ECO script to move the diode to a second metal layer below the first metal layer.

19. The system of claim 18, wherein the computer program code further causes the IC device design system to:
mark the net comprising the pin failing the test to determine the antenna effect; and
identify, with the processor, a suspect cell of the net based on the marking using an automatic place and route (APR) tool.

20. The system of claim 19, wherein the computer program code further causes the IC device design system to:
mark a gate corresponding to the pin failing the test to determine the antenna effect; and
identify a cell based on the gate marking using the APR tool.

* * * * *